US008281065B2

(12) United States Patent
Byom et al.

(10) Patent No.: US 8,281,065 B2
(45) Date of Patent: Oct. 2, 2012

(54) SYSTEMS AND METHODS FOR DETERMINING THE STATUS OF MEMORY LOCATIONS IN A NON-VOLATILE MEMORY

(75) Inventors: Matthew Byom, Campbell, CA (US); Kenneth Herman, San Jose, CA (US)

(73) Assignee: Apple Inc., Cupertino, CA (US)

( * ) Notice: Subject to any disclaimer, the term of this patent is extended or adjusted under 35 U.S.C. 154(b) by 614 days.

(21) Appl. No.: 12/551,815

(22) Filed: Sep. 1, 2009

(65) Prior Publication Data

US 2011/0055454 A1    Mar. 3, 2011

(51) Int. Cl.
*G06F 12/00* (2006.01)
(52) U.S. Cl. ......... 711/103; 714/746; 714/758; 714/768
(58) Field of Classification Search ........................ None
See application file for complete search history.

(56) References Cited

U.S. PATENT DOCUMENTS

| | | | |
|---|---|---|---|
| 7,340,655 B2 * | 3/2008 | Sugita | 714/700 |
| 7,394,691 B2 | 7/2008 | Shibata et al. | |
| 2002/0184579 A1 * | 12/2002 | Alvarez et al. | 714/719 |
| 2008/0288715 A1 | 11/2008 | Maddali et al. | |

OTHER PUBLICATIONS

Micron Technology, Inc., "An Introduction to NAND Flash and How to Design It in to Your Next Product," TN-29-19: NAND Flash 101, 2006, pp. 1-28.

* cited by examiner

*Primary Examiner* — Jared Rutz
*Assistant Examiner* — Baboucarr Faal
(74) *Attorney, Agent, or Firm* — Kramer Levin Naftalis & Frankel LLP

(57) ABSTRACT

Systems and methods are provided for storing data in a portion of a non-volatile memory ("NVM") such that the status of the NVM portion can be determined with high probability on a subsequent read. An NVM interface, which may receive write commands to store user data in the NVM, can store a fixed predetermined sequence ("FPS") with the user data. The FPS may ensure that a successful read operation on a NVM portion is not misinterpreted as a failed read operation or as an erased NVM portion. For example, if the NVM returns an all-zero vector when a read request fails, the FPS can include at least one "1" or one "0", as appropriate, to differentiate between successful and unsuccessful read operations. In some embodiments, the FPS may also be used to differentiate between disturbed data, which passes an error correction check, and correct data.

24 Claims, 3 Drawing Sheets

SYSTEMS AND METHODS FOR DETERMINING THE STATUS OF MEMORY LOCATIONS IN A NON-VOLATILE MEMORY

FIELD OF THE INVENTION

This can relate to systems and methods for storing data in a memory location of a non-volatile memory such that the status of the memory location can be determined with high probability.

BACKGROUND OF THE DISCLOSURE

NAND flash memory, as well as other types of non-volatile memories ("NVMs"), are commonly used in electronic devices for mass storage. For example, consumer electronics such as portable media players often include flash memory to store music, videos, and other media.

Today's consumer electronics often include an embedded system that controls the operations of the device and performs access requests to the NVM (e.g., read, program, or erase commands). When power is initially applied to the electronic device, the electronic device may scan through the NVM to determine the contents of the NVM. During the scan or in response to normal run-time access requests, the NVM can provide information indicating the status of each memory location (e.g., page). For example, from the provided information, the electronic device can determine whether each page includes valid data, obsolete data, correct or correctable data, disturbed data, is erased, or the NVM can signal a failed access attempt. Difficulties may arise during the operation of the electronic device if the status of a memory location in the NVM is misinterpreted.

SUMMARY OF THE DISCLOSURE

Accordingly, systems and methods are provided that allow an electronic device to determine the status of a memory location of a non-volatile memory ("NVM"). For example, the disclosed systems and methods enable the electronic device to distinguish between successful and failed read operations with high probability, and to distinguish disturbed data, which satisfies an error correction check, from correct data.

In some embodiments, an electronic device is provided that may include a system-on-a-chip and a NVM. In some embodiments, the NVM may include flash memory, such as NAND flash memory.

The system-on-a-chip can include a NVM interface, sometimes referred to herein as a "memory interface," for accessing the NVM. In some embodiments, the memory interface can include a NVM driver that may receive requests from a file system to store user data in the NVM. The NVM driver, or simply "memory driver," may be software or firmware-based. The NVM driver can create a data vector based on the user data, which the memory interface can store in a suitable location of the NVM. For example, the memory interface can include a bus controller for communicating with the NVM and for programming the data vector to a particular location in the NVM.

In some embodiments, the data vector can include a data field for holding the user data and a metadata field for holding metadata. The metadata field may include the remaining positions in the data vector not used to hold user data, and may be used to store metadata or information about or relating to the user data (e.g., error correcting code data or a logical address received from the file system).

The memory driver can provide a fixed predetermined sequence in at least a portion of the metadata field of the data vector. In some embodiments, the memory driver can provide the same fixed predetermined sequence in the metadata field responsive to all write requests from the file system. In these embodiments, the memory interface may store a fixed predetermined sequence in the metadata field in each location (e.g., page) of the NVM that is also used by the memory interface to store user data.

The fixed predetermined sequence can ensure that the memory interface is able to determine the status of each page upon a subsequent read out of the page. For example, the NVM may provide the NVM interface with a vector of a particular value, sometimes referred to as a "no-access vector," if a failed read operation occurs. The read operation may fail if, for example, the NVM interface attempts to read from a fused memory location (e.g., page), which a vendor of the NVM may fuse to disallow accesses to an initial bad block. In some embodiments, the NVM may provide an all-zero no-access vector if a failed read operation occurs. Thus, the fixed predetermined sequence can include at least one "1" to prevent data successfully read from the NVM from being mistakenly interpreted as a failed read operation. That is, even if the user data and the other metadata contain all zeros, the fixed predetermined sequence can ensure that the entire data vector read from the NVM does not match the no-access vector.

The fixed predetermined sequence can further ensure that incorrect data read from the NVM, which passes an error correction check, may not get misinterpreted as correct data. In particular, error-causing phenomena such as program disturb may cause memory locations in the NVM to change state (e.g., from an unprogrammed "1" to a programmed "0"), and in extreme cases may cause a page of the NVM to store all zeros. For conventional error correction code ("ECC") algorithms, an all-zero vector may be a valid codeword. Thus, by introducing a non-zero fixed predetermined sequence into each data vector, an all-zero vector essentially becomes an invalid codeword. In other words, because user data containing all zeros would not be programmed into the NVM as an all-zero data vector, the memory interface may interpret a read operation that returns all zeros as one containing errors.

In embodiments where the NVM provides a non-zero no-access vector or the memory interface is configured to avoid using a non-zero valid codeword, the predetermined sequence may be selected to be suitably different from the no-access vector or valid codeword. For example, the NVM interface may use a fixed predetermined sequence that has a large or non-zero Hamming distance from a corresponding location in the no-access vector or codeword.

In some embodiments, the memory driver may use a predetermined sequence that is not fixed for all data vectors. For example, the memory driver can select between multiple predetermined sequences to be used in at least a portion of a data vector's metadata field. The selection may be based on other information in the data vector (e.g., user data), for example.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Figure 1:
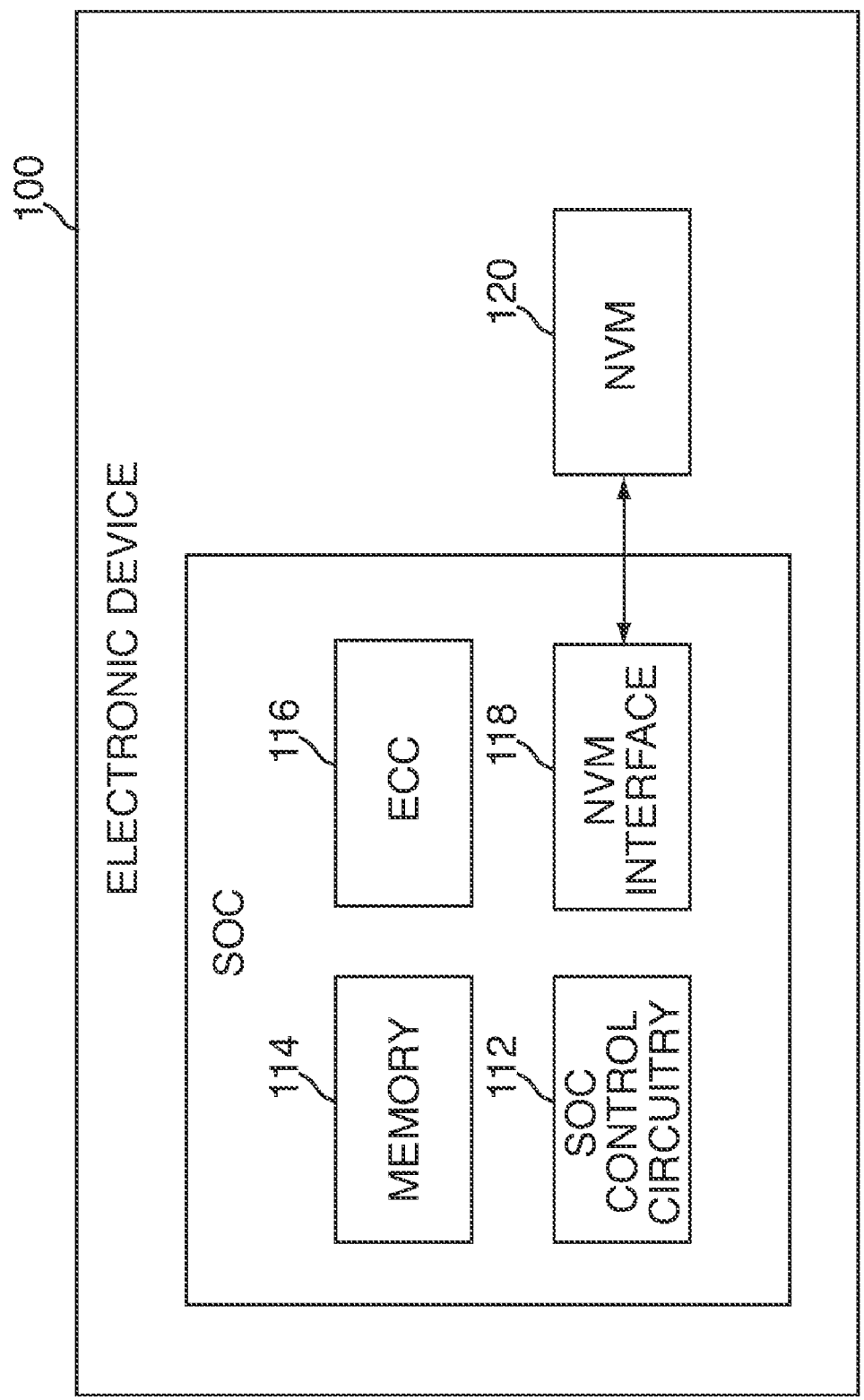
FIGS. 1 and 2 are schematic views of electronic devices configured in accordance with various embodiments of the invention.

FIG. 1 is a schematic view of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), any other known or future types of non-volatile memory technology, or any combination thereof. NVM 120 can be organized into "blocks" that may each be erasable at once, and further organized into "pages" that may each be programmable and readable at once. In some embodiments, NVM 120 can include multiple integrated circuit die and/or multiple packages, where each integrated circuit die may have multiple blocks. Each memory location (e.g., page or block) of NVM 120 can be addressed using a physical address (e.g., physical page address or physical block address).

FIG. 1, as well as later figures and various disclosed embodiments, may sometimes be described in terms of using flash technology. However, this is not intended to be limiting, and any other type of non-volatile memory can be implemented instead. Electronic device 100 can include other components, such as a power supply or any user input or output components, which are not depicted in FIG. 1 to prevent overcomplicating the figure.

System-on-a-chip 110 can include SoC control circuitry 112, memory 114, error correction code ("ECC") module 116, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile or non-volatile memory, such as dynamic random access memory ("DRAM"), synchronous dynamic random access memory ("SDRAM"), double-data-rate ("DDR") RAM, cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

ECC module 116 can be configured to encode and decode information using any suitable error correction code (e.g., Reed-Solomon ("RS") or Bose, Chaudhuri and Hocquenghem ("BCH") code). In some embodiments, ECC module 116 may implement an error detecting code instead of or in addition to an error correcting code (e.g., cyclic redundancy check ("CRC")). ECC module 116 can be implemented in hardware such as, for example, one or more linear feedback shift registers ("LFSRs"), or may be implemented in software or firmware that is executed by a processor. For software implementations, corresponding program code may be stored in NVM 120 or memory 114.

NVM interface 118 may include any suitable combination of hardware, software, and firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, integrated circuits) of NVM 120 and the data stored therein (e.g., user data). For example, NVM interface 118 can interpret the read or write commands from SoC control circuitry 112, direct ECC module 116 to encode user data that will be stored in NVM 120, direct ECC module 116 to decode user data read from NVM 120, perform garbage collection, perform wear leveling, and generate read and program instructions compatible with the bus protocol of NVM 120.

While NVM interface 118, ECC module 116, and SoC control circuitry 112 are shown as separate modules, this is intended only to simplify the description of the embodiments of the invention. It should be understood that these modules may share hardware components, software components, or both. For example, a processor implemented as part of SoC control circuitry 112 may execute a software-based memory driver for NVM interface 118. Accordingly, integrated portions of SoC control circuitry 112 and NVM interface 118 may sometimes be referred to collectively as "control circuitry."

FIG. 1 illustrates an electronic device where NVM 120 may not have its own controller. In other embodiments, electronic device 100 can include a target device, such as a flash or SD card, that includes NVM 120 and some or all of portions of NVM interface 118 (e.g., a translation layer, discussed below). In these embodiments, SoC 110 or SoC control circuitry 112 may act as the host controller for the target device. For example, as the host controller, SoC 110 can issue read and write requests to the target device.

Figure 2:
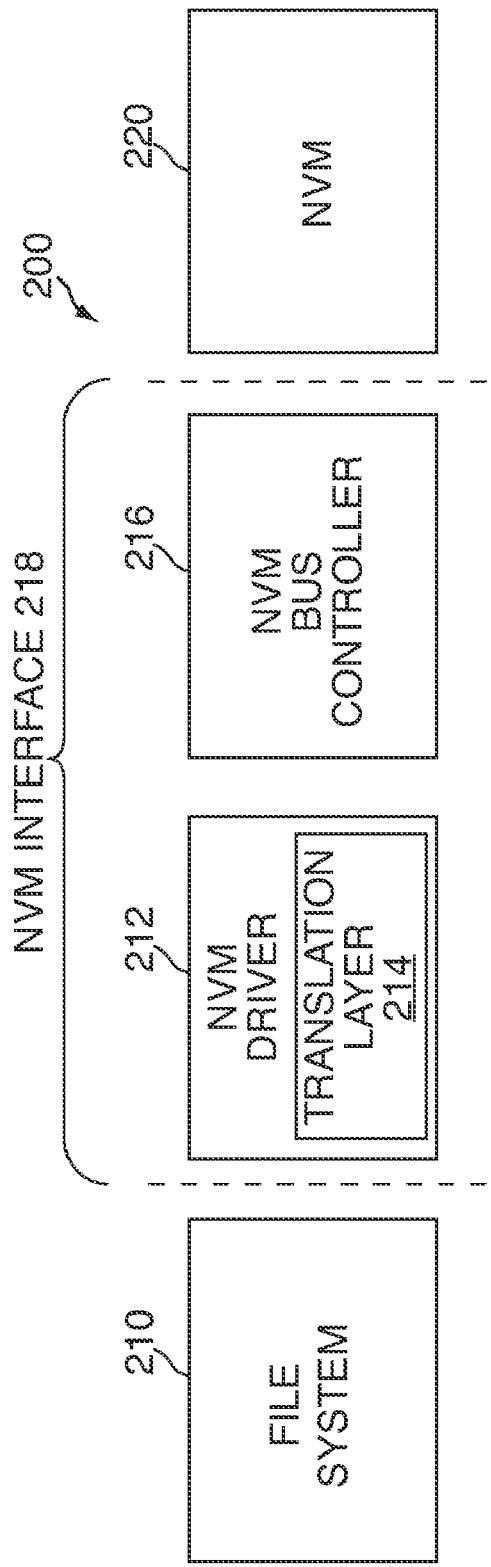

FIG. 2 is a schematic view of electronic device 200, which may illustrate in detail some of the software and hardware components of electronic device 100 (FIG. 1) in accordance with various embodiments. Electronic device 200 may therefore have any of the features and functionalities described above in connection with FIG. 1, and vice versa. Electronic device 200 can include file system 210, NVM driver 212, NVM bus controller 216, and NVM 220. File system 210 and NVM driver 212 may be software modules, and NVM bus controller 216 and NVM 220 may be hardware modules.

Accordingly, NVM driver 212 may represent the software aspect of NVM interface 218, and NVM bus controller 216 may represent the hardware aspect of NVM interface 218.

File system 210 can include any suitable type of file system, such as a File Allocation Table ("FAT") file system, and may be part of the operating system of electronic device 200 (e.g., part of SoC control circuitry 112 of FIG. 1). In some embodiments, file system 210 may include a flash file system, such as Yet Another Flash File System ("YAFFS"). In these embodiments, file system 210 may perform some or all of the functionalities of NVM driver 212 discussed below, and therefore file system 210 and NVM driver 212 may or may not be separate modules.

File system 210 may manage file and folder structures for the application and operating system. File system 210 may operate under the control of an application or operating system running on electronic device 200, and may provide write and read commands to NVM driver 212 when the application or operating system requests information that is stored in NVM 220 or requests that information be stored in NVM 220. Along with each read or write command, file system 210 can provide a logical address to indicate where the user data should be read from or written to, such as a logical page address or a logical block address with a page offset.

File system 210 may provide read and write requests to NVM driver 212 that are not directly compatible with NVM 220. For example, the logical addresses may use conventions or protocols typical of hard-drive-based systems. A hard-drive-based system, unlike flash memory, can overwrite a memory location without first performing a block erase. Moreover, hard drives do not need wear leveling to increase the lifespan of the device. Therefore, NVM interface 218 can perform any functions that are memory-specific, vendor-specific, or both to handle file system requests and perform other management functions in a manner suitable for NVM 220.

NVM driver 212 can include translation layer 214. In some embodiments, translation layer 214 may be a flash translation layer ("FTL"). On a write operation, translation layer 214 can map the provided logical address to a free, erased physical location on NVM 220. On a read operation, translation layer 214 can use the provided logical address to determine the physical address at which the requested data is stored. Since each NVM may have a different layout depending on the size or vendor of the NVM, this mapping operation may be memory and/or vendor specific. Translation layer 214 can perform any other suitable functions in addition to logical-to-physical address mapping. For example, translation layer 214 can perform any of the other functions that are typical of flash translation layers, such as garbage collection and wear leveling.

On a write request from file system 210, NVM driver 212 can create a data vector that may be programmed into a memory location of NVM 220. The data vector may be programmed into, for example, a page of NVM 220 corresponding to a physical address selected by translation layer 214. The data vector can include the user data provided by file system 210, as well as any other suitable information associated with the user data. An example of the structure and information included in a data vector is described below in connection with FIG. 3.

NVM driver 212 may interface with NVM bus controller 216 to complete NVM access requests (e.g., program, read, and erase requests). For example, NVM driver 212 may provide NVM bus controller 216 with the physical address at which to store or retrieve data, and, for program requests, the corresponding data vector to be programmed. Bus controller 216 may act as the hardware interface to NVM 220, and can communicate with NVM 220 using the bus protocol, data rate, and other specifications of NVM 220.

NVM driver 212 may generate memory management data and direct other modules to generate memory management data to manage the storage of data vectors in NVM 220. This memory management data may be referred to sometimes as "metadata." The metadata may include information specific to the user data received from file system 210. For example, the metadata may include any information created by translation layer 214 to maintain the mapping between the logical and physical address for that user data. As an additional example, NVM driver 212 may direct ECC module 116 to generate metadata in the form of redundant information for the user data.

NVM driver 212 may generate metadata that includes information that is not specific to user data. For example, NVM driver 212 may generate metadata that is useful for bad block management, garbage collection, and wear leveling. In some embodiments, NVM driver 212 may direct NVM bus controller 216 to store metadata that is specific or not specific to user data in NVM 220. For example, NVM driver 212 may direct NVM bus controller 216 to store metadata in specific pages of NVM 220 (e.g., the first page(s) of each block) and/or to store metadata within a data vector, as illustrated in FIG. 3.

Figure 3:
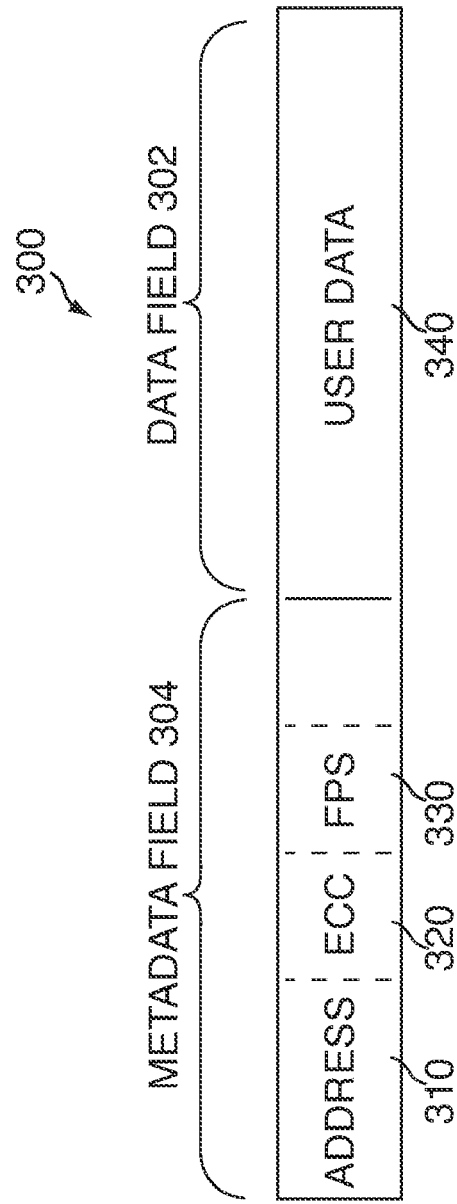
FIG. 3 is a graphical view of a data vector that may be stored in a portion of a non-volatile memory in accordance with various embodiments of the invention.

FIG. 3 shows a graphical view of an illustrative data vector 300 that may be generated by NVM driver 212 for storage in any suitable portion of NVM 220 (FIG. 2). Thus, in some embodiments, the size of data vector 300 may correspond to the size of a page in NVM 220. Data vector 300 can include a data field 302 and a metadata field 304. Data field 302 can include user data 340 received from file system 210, for example. NVM driver 212 can create a vector similar to data vector 300 responsive to each request from file system 210 to store user data.

In some embodiments, metadata field 304 of data vector 300 can include the positions in data vector 300 not used to store user data 340. The size of metadata field 304 may therefore be based on the size of the pages in NVM 220 and the size of user data 340. In other embodiments, the data and metadata fields may not encompass all of the positions in data vector 300.

Metadata field 304 can include a variety of different sub-fields. Some of the sub-fields may be used to hold metadata specific to user data 340. For example, metadata field 304 can include address sub-field 310 for storing the logical address corresponding to user data 340. Metadata field 304 can include ECC sub-field 320 for storing the redundant information generated by an ECC module (e.g., ECC module 116 of FIG. 1). Any other suitable types of metadata may also be included as a sub-field in metadata field 304.

Data vector 300 may store the logical address for user data 340 in address sub-field 310 so that, on power up of NVM 220, NVM interface 218 can re-establish the mapping between physical and logical addresses. For example, on power-up, NVM interface 218 can scan through the memory locations of NVM 220 to identify which physical pages correspond to which logical pages. Data vector 300 may also include a sub-field (not shown) that indicates whether the page contains valid data or old, obsolete data for the logical address. For example, this sub-field may indicate the age or version/generation of the page, which NVM interface 218 can use to determine whether the page contains valid or obsolete data. Thus, based on the metadata field extracted from data vector 300 for each page, NVM interface 218 can determine the status of at least some of the physical pages of NVM 220.

For other physical pages, reading the page at power-up may not produce a logical address and an age or version indicator. This can happen when the page is erased and contains no data or when there is a failed access operation to the particular memory location (e.g., page). For flash memory, a page containing all ones may be an indicator that the page has been erased. For some flash vendors, a read-out vector, sometimes referred to as a "no-access vector," that includes all zeros may be used to indicate a failed page access, such as when a vendor of NVM 220 fuses those memory locations to prevent access to initial bad blocks. Therefore, on power-up, NVM interface 218 can attempt to distinguish erased pages and read failures from pages that contain data, whether current or obsolete, based on whether the returned data vector contains all zeros or all ones.

The ability for NVM interface 218 to identify the status of each page on power-up may be important for the operation of NVM interface 218. This may also be important at other stages of operation as well. For example, NVM interface 218 may receive read requests from file system 210 during run-time operation of electronic device 200 (e.g., after power-up), and NVM interface 218 may need to determine whether a read operation to the corresponding page is successful. Also, during run-time NVM interface 218 may need to determine whether a page stores correct or disturbed data. Accordingly, the various embodiments disclosed herein provide systems and methods that ensure that the status (e.g., erased/programmed/fused, correctness, etc.) of each page can be determined correctly with high probability.

In conventional flash systems, however, even though an all-zero no-access vector may be used to signal a failed read operation, it may still be possible to store a valid all-zero data vector in a page of the NVM. This may occur if a file system issues a command to write an all-zero user data vector to the NVM, and an NVM interface thereafter attaches an all-zero metadata field. For example, if the user data and other metadata sub-fields (e.g., address sub-field 310) contain only zeros, an ECC module (e.g., ECC module 116 of FIG. 1) protecting the user data and the other metadata sub-fields may produce redundant information (e.g., for ECC sub-field 320) that also includes only zeros. Thus, for conventional ECC algorithms, an all-zero vector may be a valid codeword that NVM interface 218 could program into a page of NVM 220. When this page is subsequently read out from NVM 220, however, NVM interface 218 would not be able to distinguish this read-out vector from one signaling a read failure.

To prevent this problem, NVM interface 218 can include a fixed predetermined sequence ("FPS") in the metadata field of each data vector. For example, referring again to FIG. 3, metadata field 304 of data vector 300 can include FPS sub-field 330 for storing the fixed predetermined sequence. The FPS may be "fixed" in that NVM interface 218 may use the same FPS for each request from file system 210 to write user data to NVM 220. The FPS may be independent of any information provided from file system 210 to NVM interface 218. In some embodiments, NVM interface 218 may obtain the value of the FPS from a lookup table stored in memory (e.g., memory 114 or NVM 120 of FIG. 1), or the value of the FPS may be hard-coded are hardwired into NVM interface 218.

NVM interface 218 may use the fixed predetermined sequence to ensure that the resulting data vector can be distinguished from vectors signaling other statuses. For example, if an all-zero no-access vector is used to signal a failed read access, FPS sub-field 330 can contain at least one "1" to prevent successful read operations of data vector 300 from being interpreted as unsuccessful. With at least one "1" in FPS sub-field 330, an ECC module (e.g., ECC module 116 of FIG. 1) can amplify the Hamming distance of data vector 300 from an all-zero vector by generating non-zero redundant data for use in ECC sub-field 320. In some embodiments, if an all-one vector is used to signal an erased page, FPS sub-field 330 can contain at least one "0" so that data vector 300 may not be misinterpreted as corresponding to an erased state.

In addition to preventing misinterpretation of failed read accesses, the fixed predetermined sequence can further ensure that incorrect data read from NVM 220, which passes an error correction check from ECC module 116 (FIG. 1), for example, may not be misinterpreted as correct data. In particular, error-causing phenomena such as program disturb may cause memory locations in NVM 220 to change state (e.g., from an unprogrammed "1" to a programmed "0"). In extreme cases, the error-causing phenomena may cause a page of NVM 220 to change from storing a non-zero data vector 300 to an all-zero vector. For conventional error correction code ("ECC") algorithms that may be employed by ECC module 116, an all-zero vector may be a valid codeword. Thus, by introducing a non-zero fixed predetermined sequence into each data vector, an all-zero vector essentially becomes an invalid codeword, because even user data containing all zeros would not be programmed into NVM 220 as an all-zero data vector. The fixed predetermined sequence may effectively reduce the codeword space of the employed ECC so that certain valid codewords of the ECC, sometimes referred to herein as "problematic valid codewords," are not. Therefore, in response to reading an all-zero vector or other problematic valid codeword from NVM 220, NVM interface 218 may interpret the read data as incorrect even though the read data is a valid codeword in the employed ECC scheme.

The FPS may have any suitable value as long as the FPS is different in at least one position from vectors signaling other statuses or from problematic valid codewords. In some embodiments, the FPS may be chosen to have a large Hamming distance from the vectors indicating other statuses or from problematic valid codewords. For example, if NVM interface 218 only needs to avoid ambiguity between a data vector and an all-zero no-access vector or problematic codeword, the FPS may be an all-one vector. This way, for no-access vectors, all but one bit of the data vector could be read from NVM 220 in error (e.g., as zeros) and NVM interface 218 would still be able to determine that a successful read operation occurred. As described above, NVM interface 218 may additionally rely on an ECC module (e.g., ECC module 116) to increase the Hamming distance of data vector 300 from an all-zero vector. If NVM interface 218 is configured to avoid having a data vector read from NVM 220 from being interpreted as either a failed read operation or as an erased page, the FPS may contain half ones and half zeros. This way, at least some errors would need to occur in order for the FPS to be ineffective.

The FPS of sub-field 330 can be of any suitable length (e.g., 2 bits, 1 byte, etc.). In some embodiments, NVM interface 218 may generate a larger sub-field 330 to provide greater protection against instances of status misinterpretation. In other embodiments, NVM interface 218 may generate a smaller sub-field 330 to decrease the percentage of storage space that is used for metadata. In still other embodiments, the size of FPS sub-field 330 may be selected based on the remaining space available in a page after considering the size of user data 340 and the other metadata sub-fields.

It should be understood that this technique for including FPS sub-field 330 may be used even if a vector other than an all-zero vector is used to indicate an unsuccessful read operation or if a non-zero valid codeword is problematic for some reason. In these scenarios, the value of FPS sub-field 330 should be different (e.g., have a non-zero Hamming distance) from a corresponding location in the no-access vector or the problematic valid codeword. For example, if a " . . . 101010-10 . . . " vector is used to signal a read failure, the FPS could be " . . . 01010101 . . . ". Also, while the various disclosed embodiments may be described as distinguishing successful read operations from failed read operations and/or erased pages, and for avoiding the use of problematic codewords, this technique may be used to differentiate between any suitable statuses that may be used by a NVM in current or future systems.

It should also be understood that the structure of data vector 300 is merely illustrative, and additional fields or sub-fields may be added to data vector 300. In some embodiments, the order of fields and sub-fields may be rearranged. For example, some of the metadata sub-fields may come before the data field and some of the metadata sub-fields may come after the data field. In some embodiments, ECC sub-field 330 may represent a parity field in a systematic codeword, and therefore may be positioned at an end of data vector 300. Also, it should be understood that FIG. 3 is not intended to illustrate the relative size of each field or sub-field, and that the fields and sub-fields may be of any suitable size and proportion with respect to the entire data vector 300.

In some embodiments, rather than using a fixed predetermined sequence, NVM interface 218 may select between using multiple predetermined sequences. For example, because of potential program disturbs that may result from programming a vector of substantially all ones in a page of flash memory, NVM interface 218 may select a predetermined sequence with more zeros if there are already a large number of ones in data vector 300. Thus, in some embodiments, NVM interface 218 may be configured to select a predetermined sequence based on the other information contained in the metadata and data fields of data vector 300.

Figure 4:
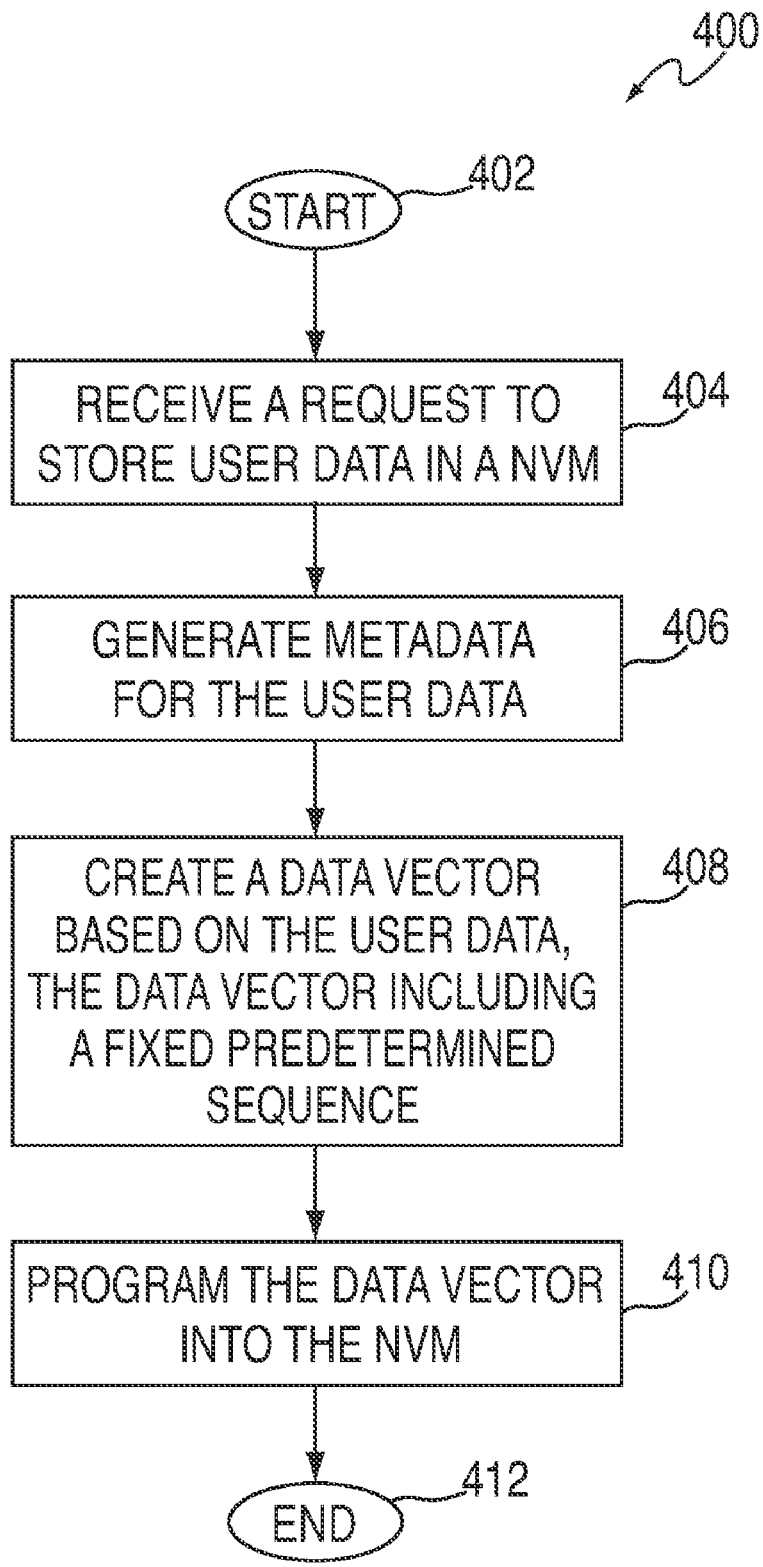
FIG. 4 is a flowchart of an illustrative process for storing user data in a portion of a non-volatile memory in accordance with various embodiments of the invention.

Referring now to FIG. 4, a flowchart of illustrative process 400 is shown for storing user data in a portion of a NVM, such as a page of flash memory (e.g., NAND flash). The steps of process 400 may be executed by a NVM interface, such as NVM interface 218 of FIG. 2. Process 400 may begin at step 402. At step 404, the NVM interface may receive a request to store user data in the NVM. The request may be received from a file system of the electronic device, for example, along with a logical address. Then, at step 406, the NVM interface may generate metadata for the received user data. This can involve determining a location of the NVM in which to store the data, such as by mapping a logical address received from the file system to a physical address of the NVM.

Continuing to step 408, the NVM interface can create a data vector. The NVM interface can create the data vector using the user data received at step 404 in a data field of the data vector and at least some of the metadata generated at step 406 in a metadata field of the data vector. The NVM interface can provide a fixed predetermined sequence in the data vector, such as within an unused portion of the metadata field. This fixed predetermined sequence can be included in the current data vector, and the same fixed predetermined sequence may also be included in various other data vectors corresponding to other write requests. For example, the NVM interface may be configured to use the same predetermined sequence on all write requests from a file system. In other embodiments, the NVM interface may be configured to select one of a number of different predetermined sequences to include in the data vector.

Creating a data vector at step 408 may further involve encoding the user data and the other metadata generated at step 406 to compute redundant information (e.g., ECC data, such as parity information). This way, the data vector may form a valid codeword within the codeword space defined by the ECC algorithm used by, for example, ECC module 116 (FIG. 1). By adding a fixed predetermined sequence, however, such as a non-zero FPS, the codeword space actually used by the NVM interface may be reduced to avoid using problematic valid codewords (e.g., an all-zero valid codeword), and therefore the data vector created at step 408 may form a valid codeword within the reduced codeword space.

At step 410, the NVM interface can program the data vector into the NVM. For example, the NVM interface can program the data vector to a physical address of the NVM generated at step 406. Process 400 may then end at step 412.

It should be understood that process 400 is merely illustrative. Any of the steps may be removed, modified, or combined, and any other steps may be added, without departing from the scope of the invention.

The described embodiments of the invention are presented for the purpose of illustration and not of limitation.

What is claimed is:

1. An electronic device comprising:
a non-volatile memory comprising a plurality of pages;
a system-on-a-chip comprising a memory interface, wherein the memory interface is configured to:
store a data vector comprising user data, error correction code, and a fixed predetermined sequence into at least one of the plurality of pages, the fixed predetermined sequence includes at least one non-zero value such that in the event a no-access vector is provided in response to a failed access, the fixed predetermined sequence of the data vector differs from data associated with the no-access vector.

2. The electronic device of claim 1, wherein the non-volatile memory comprises flash memory.

3. The electronic device of claim 1, wherein the memory interface is further configured to: read a page of the plurality of pages of the non-volatile memory; and determine that a read failure occurred when the read returns an all-zero vector.

4. The electronic device of claim 1, wherein the memory interface is further configured to: read a page of the plurality of pages of the non-volatile memory; and determine that the page contains at least one error in response to reading an all-zero vector from the page.

5. The electronic device of claim 1, wherein the memory interface comprises:
a processor configured to execute the instructions of a memory driver; and
a bus controller that communicates with the non-volatile memory.

6. The electronic device of claim 1, wherein the system-on-a-chip further comprises SoC control circuitry, wherein the SoC control circuitry comprises a file system for providing the user data to the memory interface.

7. An electronic device comprising:
a non-volatile memory;
a system-on-a-chip comprising:
control circuitry operating under the control of a plurality of software modules, the software modules comprising a file system and a memory driver, wherein:
the file system is configured to issue write commands to the memory driver to write user data to the non-volatile memory, and the memory driver is configured to create a data vector for storage in the non-volatile memory, the data vector comprising the user data, error correction code, and a predetermined sequence, wherein the fixed predetermined sequence includes at least one non-zero value such that in the event a no-access vector is provided in response to a failed access, the fixed predetermined sequence of the data vector differs from data associated with the no-access vector.

8. The electronic device of claim 7, wherein the predetermined sequence is a fixed predetermined sequence that is independent of any information provided from the file system to the memory driver.

9. The electronic device of claim 7, wherein the predetermined sequence is a fixed predetermined sequence that is the same for all write commands issued by the file system.

10. The electronic device of claim 7, wherein the predetermined sequence is selected from one of a plurality of potential sequences.

11. The electronic device of claim 7, further comprising a bus controller configured to store the data vector in the non-volatile memory.

12. The electronic device of claim 7, wherein the non-volatile memory comprises NAND flash memory.

13. The electronic device of claim 7, wherein: the file system is further configured to issue a read command to the memory driver; and the driver is further configured to: read data from a memory location of the non-volatile memory responsive to the read command; and determine that the read data includes at least one error when the read data comprises only zeros.

14. A method of storing at least first user data in a non-volatile memory, the method comprising:
receiving a first request to store the first user data in the non-volatile memory;
generating a first metadata field for the first user data, wherein the first metadata field comprises error correction code and a fixed predetermined sequence that includes at least one non-zero value such that in the event a no-access vector is provided in response to a failed access, the fixed predetermined sequence of the first metadata field differs from data associated with the no-access vector; and
storing the first user data and the first metadata field in the non-volatile memory.

15. The method of claim 14, wherein the fixed predetermined sequence has a non-zero Hamming distance from a corresponding location in a no-access vector indicating a failed access to the non-volatile memory.

16. The method of claim 14 further comprising:
receiving a second request to store second user data in the non-volatile memory, wherein the second user data comprises a different sequence of digital information than the first user data;
generating a second metadata field for the second user data, wherein the second metadata field comprises the fixed predetermined sequence; and
storing the second user data and the second metadata field in the non-volatile memory.

17. The method of claim 16 further comprising:
determining a first physical address for the first user data;
determining a second physical address for the second user data;
storing the first user data and the first metadata field at the first physical address of the non-volatile memory; and
storing the second user data and the second metadata field at the second physical address of the non-volatile memory.

18. The method of claim 14, wherein:
the receiving the first request comprises receiving a logical address at which to store the first user data; and
the generating the first metadata field comprises generating an address sub-field based on the logical address.

19. The method of claim 14 further comprising generating redundant information for the first user data using an error correcting code, wherein the generating the first metadata field comprises generating a ECC sub-field for the first user data based on the redundant information.

20. A memory interface for accessing a non-volatile memory, the memory interface comprising:
control circuitry operating under the instructions of at least a memory driver, the memory driver configured to:
receive a first request to write first user data to the non-volatile memory;
generate a first data vector comprising the first user data, error correction code, and a fixed predetermined sequence that includes at least one non-zero value such that in the event a no-access vector is provided in response to a failed access, the fixed predetermined sequence of the first data vector differs from data associated with the no-access vector;
receive a second request to write second user data to the non-volatile memory; and
generate a second data vector comprising the second user data and the same fixed predetermined sequence; and
a bus controller configured to store the first and second data vectors in the non-volatile memory.

21. The memory interface of claim 20, wherein the control circuitry is further configured to operate under the instructions of a file system, and wherein the memory driver receives the first and second requests from the file system.

22. The memory interface of claim 20, wherein the fixed predetermined sequence has a non-zero Hamming distance from a corresponding location in a no-access vector used by the non-volatile memory to indicate a failed access.

23. The memory interface of claim 20, wherein the control circuitry and the bus controller are implemented on a system-on-a-chip.

24. The memory interface of claim 20, wherein the non-volatile memory comprises flash memory.

* * * * *